United States Patent [19]

Kim et al.

[11] Patent Number: 5,313,435
[45] Date of Patent: May 17, 1994

[54] SEMICONDUCTOR MEMORY DEVICE HAVING ADDRESS TRANSITION DETECTOR

[75] Inventors: Bon-Kyoung Kim; Woong-Mu Lee, both of Seoul, Rep. of Korea

[73] Assignee: Samsung Electronics Co., Ltd., Suwon, Rep. of Korea

[21] Appl. No.: 866,852

[22] Filed: Apr. 10, 1992

[30] Foreign Application Priority Data

Jul. 31, 1991 [KR] Rep. of Korea .......................... 13273

[51] Int. Cl.[5] .......................................... G11C 11/413
[52] U.S. Cl. ..................... 365/233.5; 365/230.060; 307/480
[58] Field of Search ............... 365/233.5, 233, 203, 365/230.01, 230.06; 307/480, 481, 451, 452

[56] References Cited

U.S. PATENT DOCUMENTS

| | | | |
|---|---|---|---|
| 4,563,599 | 1/1986 | Donoghue et al. | 307/451 |
| 4,849,938 | 7/1989 | Furutani et al. | 365/203 |
| 5,003,513 | 3/1991 | Porter et al. | 365/233.5 |
| 5,091,889 | 2/1992 | Hamano et al. | 365/203 |
| 5,198,708 | 3/1993 | Gillingham | 307/481 |
| 5,198,709 | 3/1993 | O'Connell | 307/480 |

*Primary Examiner*—Eugene R. LaRoche
*Assistant Examiner*—Tan Nguyen
*Attorney, Agent, or Firm*—Hecker & Harriman

[57] ABSTRACT

An address transition detector (ATD) of a semiconductor memory device. In particular, even if the address transition of the semiconductor memory device occurs over a long time, malfunction is prevented by synchronizing outputs of a buffer and a decoder and an output of the ATD circuit. To accomplish this, input block for sensing a high trip level and a low trip level is included in the ATD circuit. Thus, if the address transition occurs slowly over a long time, the duration of a short pulse indicating the address transition becomes long, thereby producing accurate data. Moreover, since the ATD is not restricted to a particular system application, it can be used in a wide variety of applications by adapting a memory device to utilize the ATD.

10 Claims, 11 Drawing Sheets

SEMICONDUCTOR MEMORY DEVICE HAVING ADDRESS TRANSITION DETECTOR

BACKGROUND OF THE PRESENT INVENTION

Field of the Invention

The present invention relates to an address transition detector of a semiconductor memory device, and more particularly to an address transition detector capable of accurately producing data even for long address transition times.

Usually, an address transition detector (hereinafter referred to as the ATD) is used in a device such as a static RAM (Random Access Memory) or a ROM (Read Only Memory) which demands fast access speed and low power consumption. The ATD detects a variation in an address signal applied from external circuitry and generates a pulse. That is, if there is any variation in address inputs, the ATD generates a clock signal. Furthermore, even if an error in any address input occurs, the ATD receives it, thereby generating a normal internal clock signal.

FIG. 1 shows a schematic block diagram of a semiconductor memory device having an ATD. The semiconductor memory device has an address buffer 100 receiving an external signal, row decoder 200, a memory cell array 300, a column decoder and sense amplifier 400, data output buffer 500, ATD 600 and a pulse generator 700.

The read operation begins with input of wanted address signals into the address buffer. If a transition occurs in one of various input address signals, the ATD 600 senses this occurrence and generates a short pulse. Then the pulse generator 700 generates an ATD pulse such as an equalizing signal EQU, a latch signal LAT, or an inverted latch signal LATB, etc., synchronized with the short pulse.

FIG. 2 to FIG. 5 are disclosed is "IEEE JOURNAL OF SOLID-STATE CIRCUITS," VOL. 24, NO. 5, Oct. 1989, pp. 1250-pp. 1258.

FIG. 2 shows a circuit diagram of a conventional ATD. The ATD generates a short pulse when a transition of an external input address occurs, and a short pulse is generated by a delay circuit 13 (enclosed by a dashed line).

FIG. 3 shows an ATD pulse summator and a pulses generator of FIG. 1. The circuit of FIG. 3 summates the short pulses produced from the ATD to provide desired signals, such as an equalizing signal EQU, an inverted latch signal LATB and a latch signal LAT.

Now, the function of the ATD pulse is described with reference to FIG. 4. The equalizing signal EQU equalizes a bit line and a sense amplifier. The signals LAT and LATB latch valid data and disable or enable a data output buffer. That is, when the signal LAT is of a logic "high", an NMOS transistor 60 is turned on and MOS transistor 63 of an output terminal is enabled.

Next, the read operation of FIG. 4 in normal case is described with reference to FIGS. 3 and 5. When address transition occurs, a word line and a bit line are determined in a row decoder and a column decoder. In this case, signals SATB and SAT indicating the address transition are generated in the ATD, and the equalizing signal EQU synchronized with the signals SATB and SAT is generated in the ATD pulse generator. The equalizing signal EQU performs equalizing operation while the word line and bit line are selected. When the equalizing operation of the equalizing signal EQU is completed, the selected bit line varies in its potential level in response to a state of a cell, and a sense amplifier senses a level of the bit line to produce an amplified signal SA OUTPUT. Meanwhile, the inverted latch signal LATB is disabled to latch read data after the signal SA OUTPUT has changed to a stable level, producing an output signal at an input/output terminal.

When address transition occurs rapidly and is completed in a short time (a few tens of nanoseconds), i.e., during a normal operation, there is no problem in the operation. However, when the address transition occurs slowly and is only completed after a long time (a few milliseconds to a few seconds) on a multiplexed address and data bus, i.e., in the case of address floating, problems may arise. The address floating occurs when the address signal is floated for a long time in order to prevent a bus contention in a memory with a multiplexed address and data bus when the bus switches from data mode into address mode.

A read operation during the address floating is described with reference to FIG. 6. At this time, since the address is slowly changed over a long time, unwanted delay is generated between the output of the address buffer terminal and the output of the ATD for sensing the address transition. Therefore, the ATD and address signals which are intended to be synchronized by an external address signal, are not synchronized. This occurs because the trip level of the address buffer is different from that of the ATD. Accordingly, the signals SATB and SAT for detecting the address transition are firstly generated and the signals EQU and LATB synchronized with the signals SATB and SAT are also generated. Therefore, the equalizing operation and the latch of data are performed before the desired word line and bit line are selected, causing a malfunction which produces incorrect data.

SUMMARY OF THE INVENTION

It is therefore an object of the present invention to provide an address transition detector capable of accurately producing data even if an address is slowly varied over a long time.

In accordance with an aspect of the present invention, an address transition detector circuit for use in a semiconductor memory device which has an address buffer circuit for amplifying an external input address signal, a row decoder circuit for selecting a word line among a plurality of word lines, a sense amplifier for sensing data of a cell, and a pulse generator for precharging or equalizing each memory device of an integrated circuit, includes first input means connected to receive an output of the address buffer and which has a relatively high trip ratio, second input means connected to receive the output of the address buffer and which has a relatively low trip ratio, first output means connected to receive an output of the first input means, for delaying its output only when the output of the first input means is transited to a second state from a first state, and second output means connected to receive an output of the second input means, for delaying its output only when the output of the first input means is transited to the second state from the first state. The first input means includes a first inverting circuit having a high trip ratio where the ratio of channel width to channel length of a load transistor installed in the first inverting circuit is greater than four times that of a driving transistor installed therein, and the second input means includes a second inverting circuit having a low trip ratio where the ratio of channel width to channel length of a load transistor installed in the second inverting circuit is less than 0.25 times that of a driving transistor installed therein. Moreover, the first and second states are a logic "low" state under 0.8 volts and a logic "high" state above 2.4 volts in a transistor-transistor logic circuit (TTL) level, respectively.

BRIEF DESCRIPTION OF THE DRAWINGS

The advantages and features of the present invention will become more apparent by describing in detail the preferred embodiment of the present invention with reference to the attached drawings in which.

DETAILED DESCRIPTION OF THE PRESENT INVENTION

First, it should be noted that in order to produce accurate data during the address floating, an inverter circuit having a low trip level and an inverter circuit having a high trip level are connected in parallel to an input terminal which detects address transition.

Figure 1:
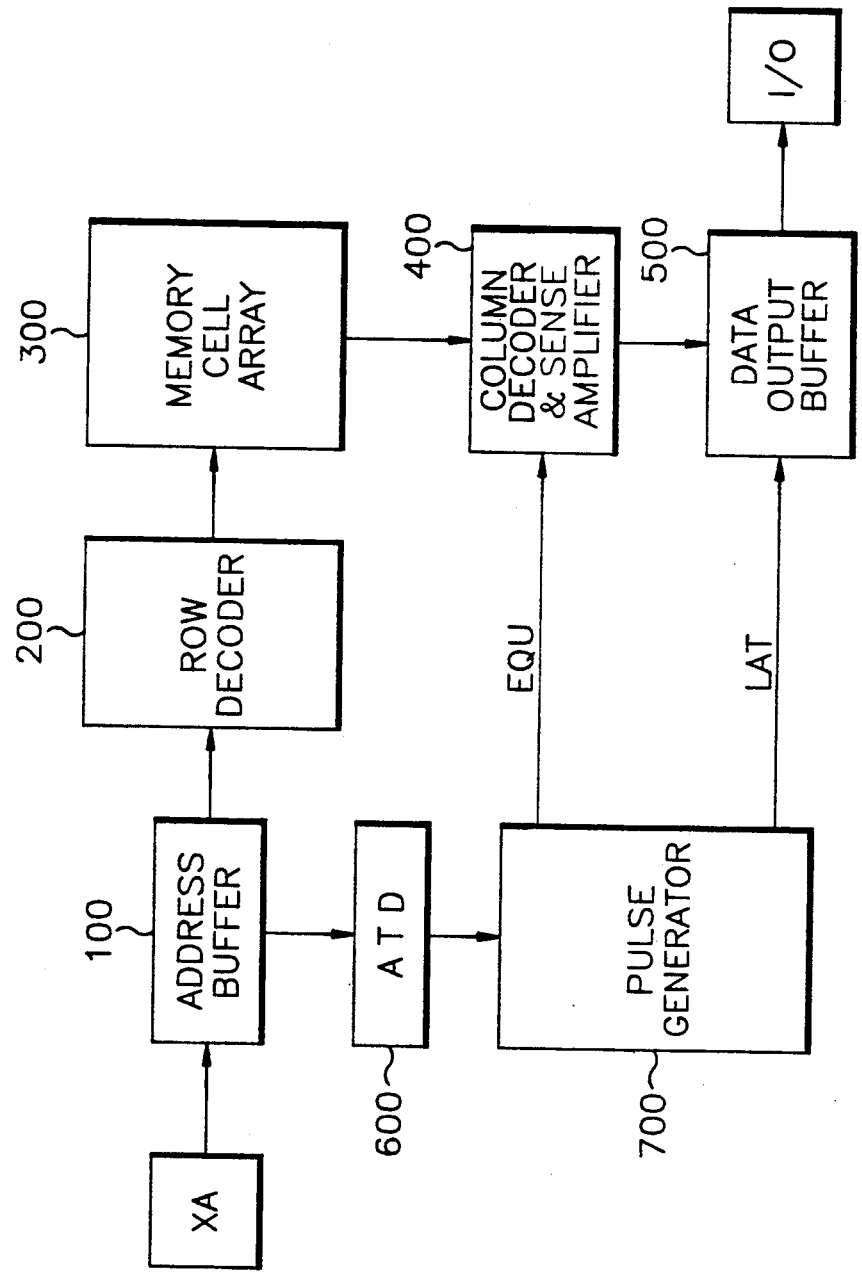
FIG. 1 is a block diagram illustrating a semiconductor memory device having an ATD.
Figure 2:
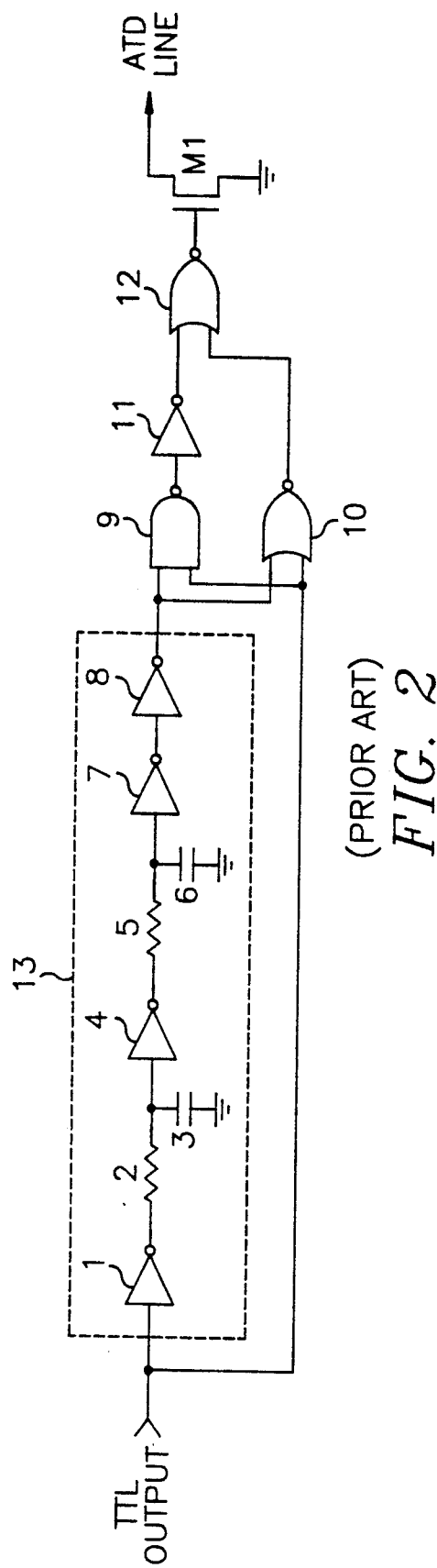
FIG. 2 is a circuit diagram illustrating a conventional ATD.
Figure 8:
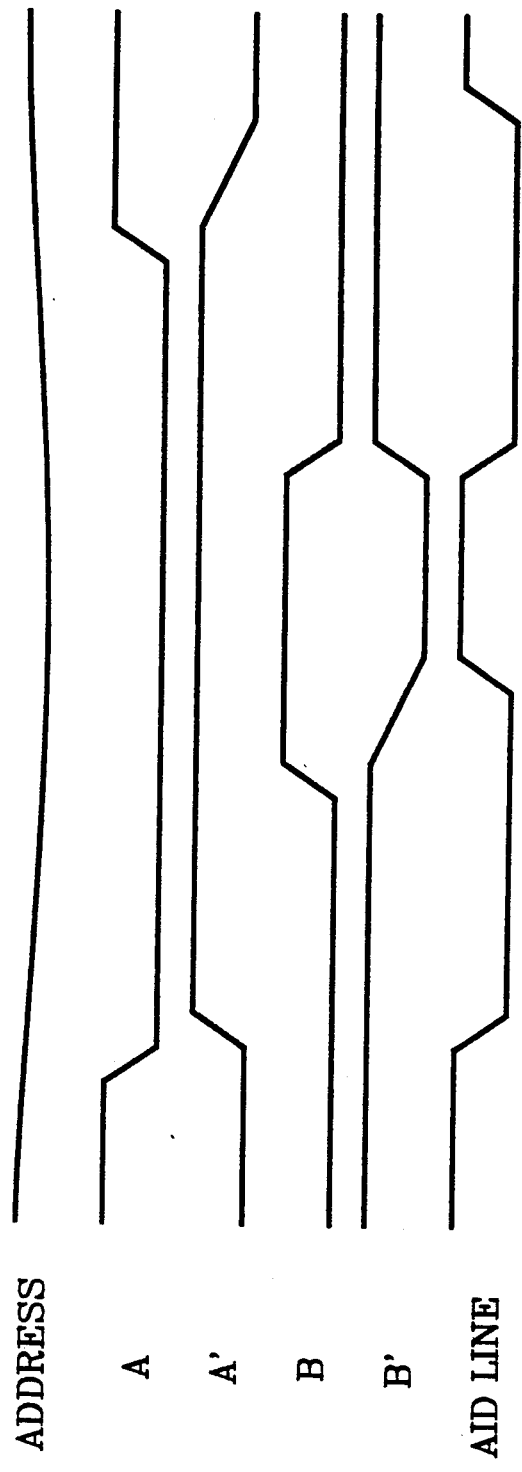
FIG. 8 is a timing chart illustrating operation according to the present invention.
Figure 3:
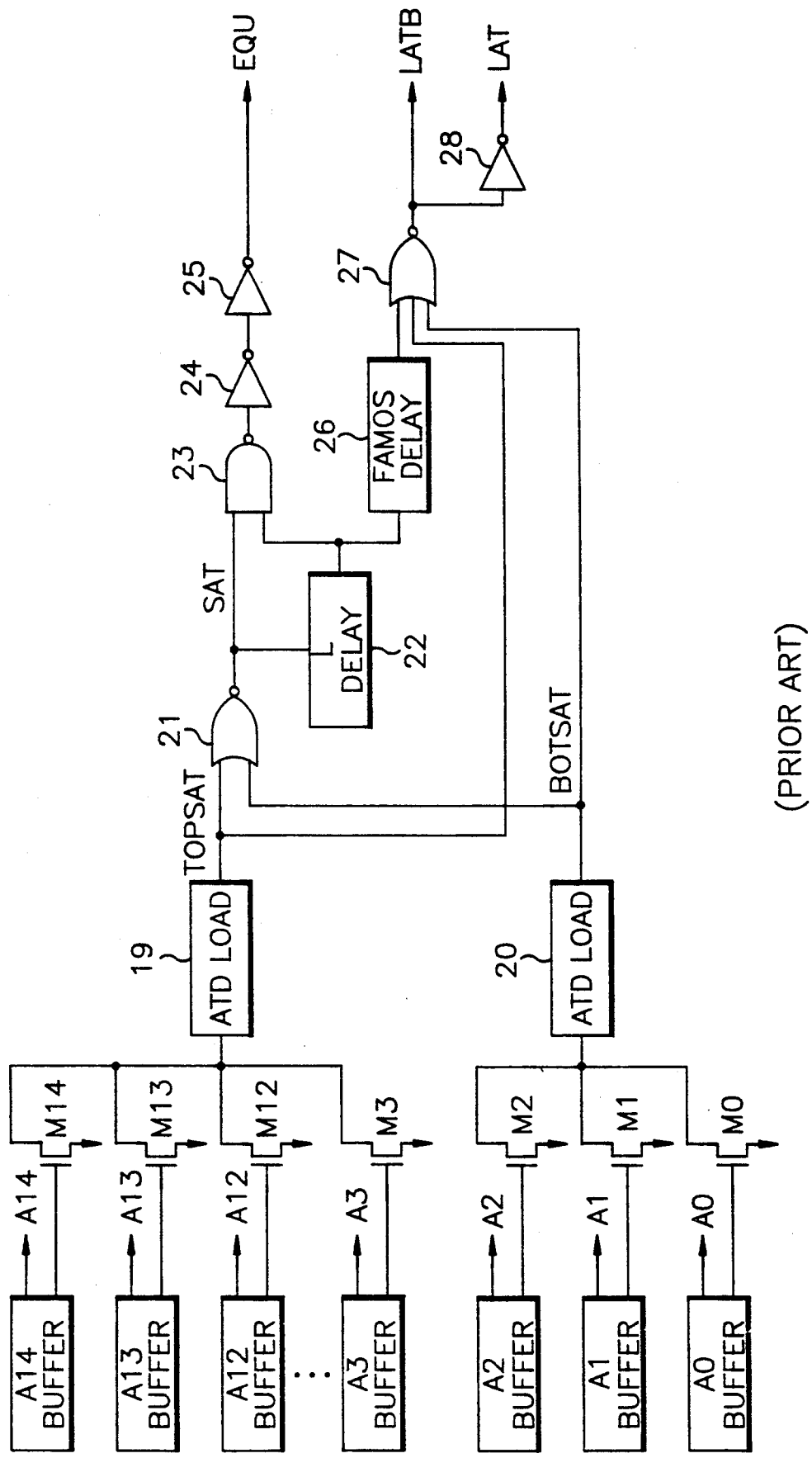
FIG. 3 is a schematic diagram illustrating an ATD pulse summator and a pulse generator of FIG. 1.
Figure 4:
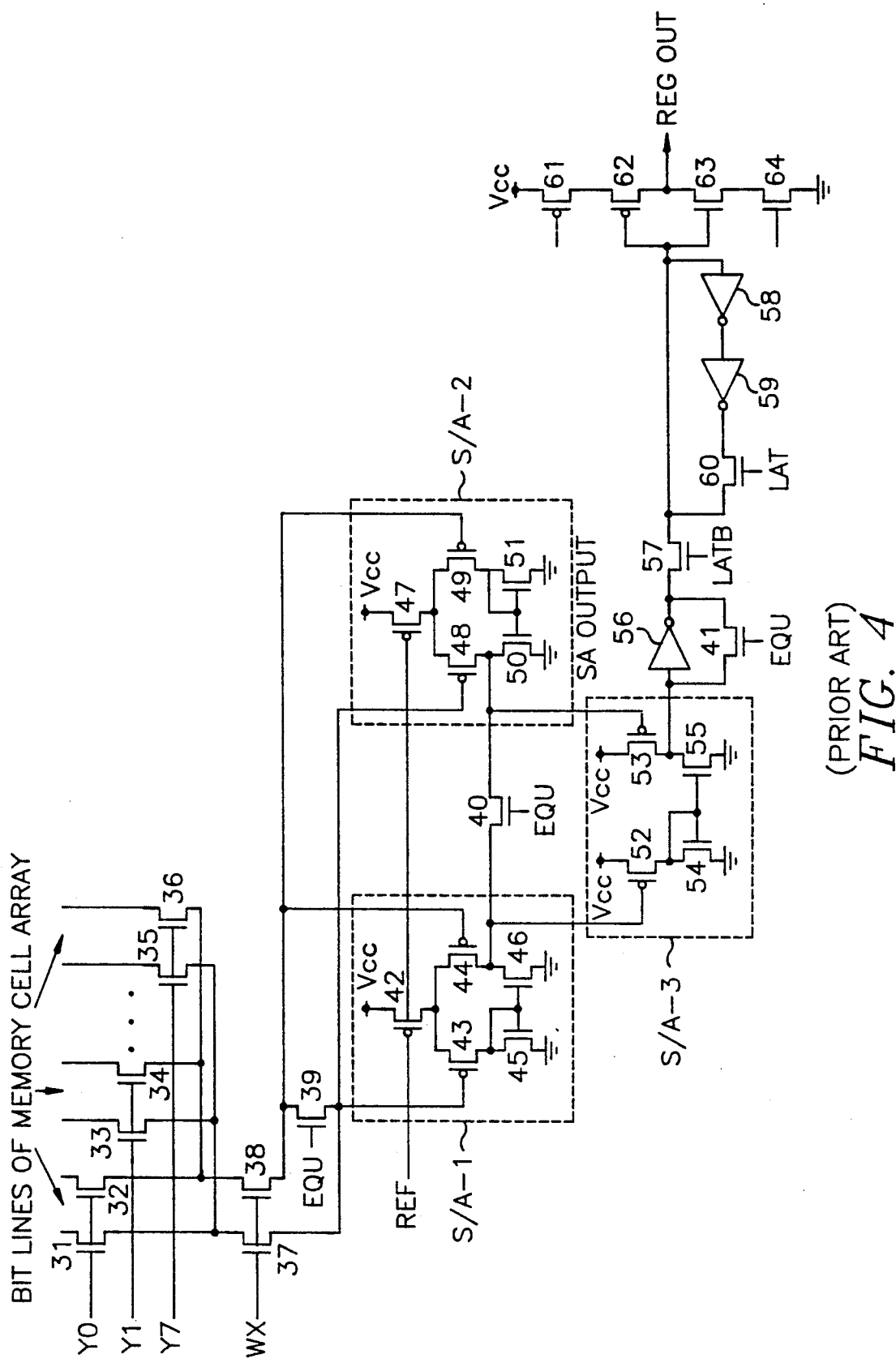
FIG. 4 is a circuit diagram illustrating a sense amplifier and a data output buffer of FIG. 1.
Figure 7:
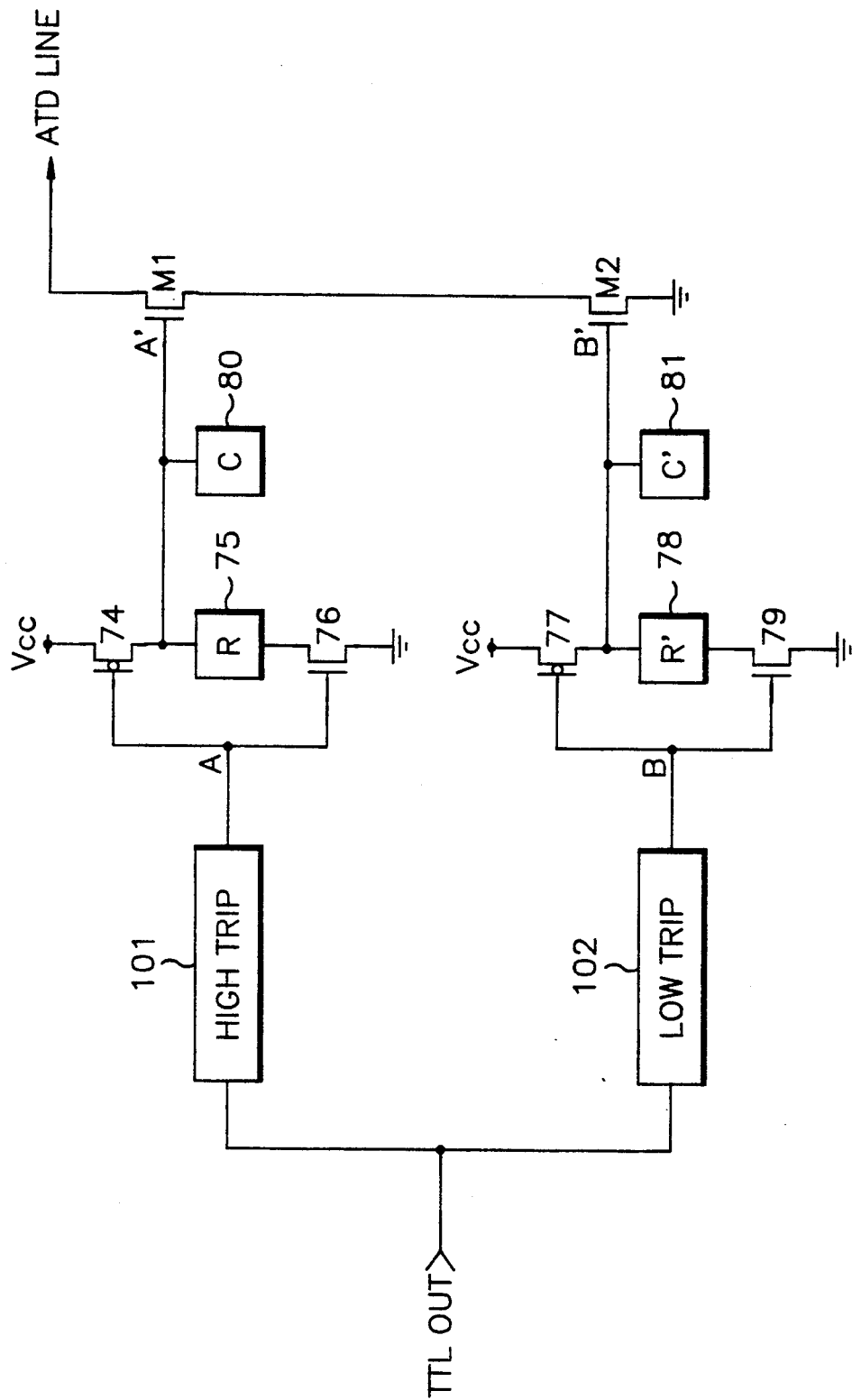
FIG. 7 is a circuit diagram illustrating an ATD according to present invention.

In FIGS. 7 and 8, if an address input is transited from a logic "high" to a logic "low" over a long time, first input means 101 having a relatively high trip level is firstly tripped. A second input means 102 is tripped after the first input means 101 is tripped since the second input means 102 has a lower trip level than the first input means 101. A node A is tripped at a high level and is lowered to a logic "low" from a logic "high". Moreover, a node A' receives an output of the node A and changes to a logic "high" without delay. Meanwhile, a node B is transited from a logic "low" to a logic "high," and a node B' receives an output of the node B and slowly changes to a logic "low" through R'C' delay 78, 81. By contrast, in case the address input is converted from a logic "low" to a logic "high," node A is transited from logic "low" to the logic "high," and the node A' receives the output of the node A to slowly transited to logic "low" through RC delay 75, 80. The node B is transited to a logic "low" from a logic "high" and the node B' receives the output of the node B and changes to a logic "high" without delay.

On a driving line ATD LINE, a pulse is generated by receiving signals from the nodes A' and B', and a pulse generator summates the pulses received from the driving line ATD LINE, generating pulses EQU, LATB and LAT, and provides a desired signal to the circuitry of an integrated circuit.

Figure 5:
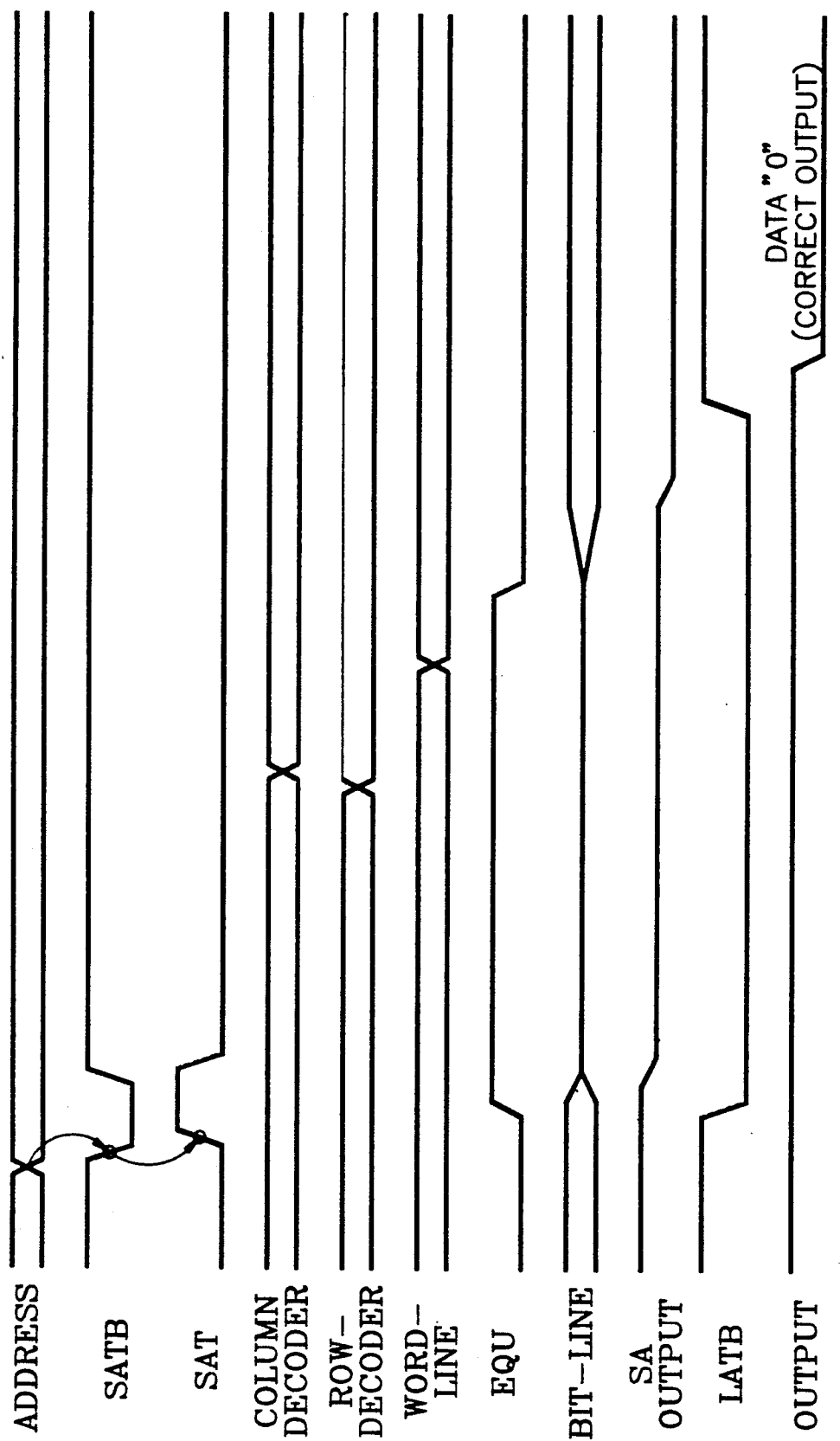
FIG. 5 is a timing chart illustrating a read operation during the normal operation of the device of FIG. 1.
Figure 6:
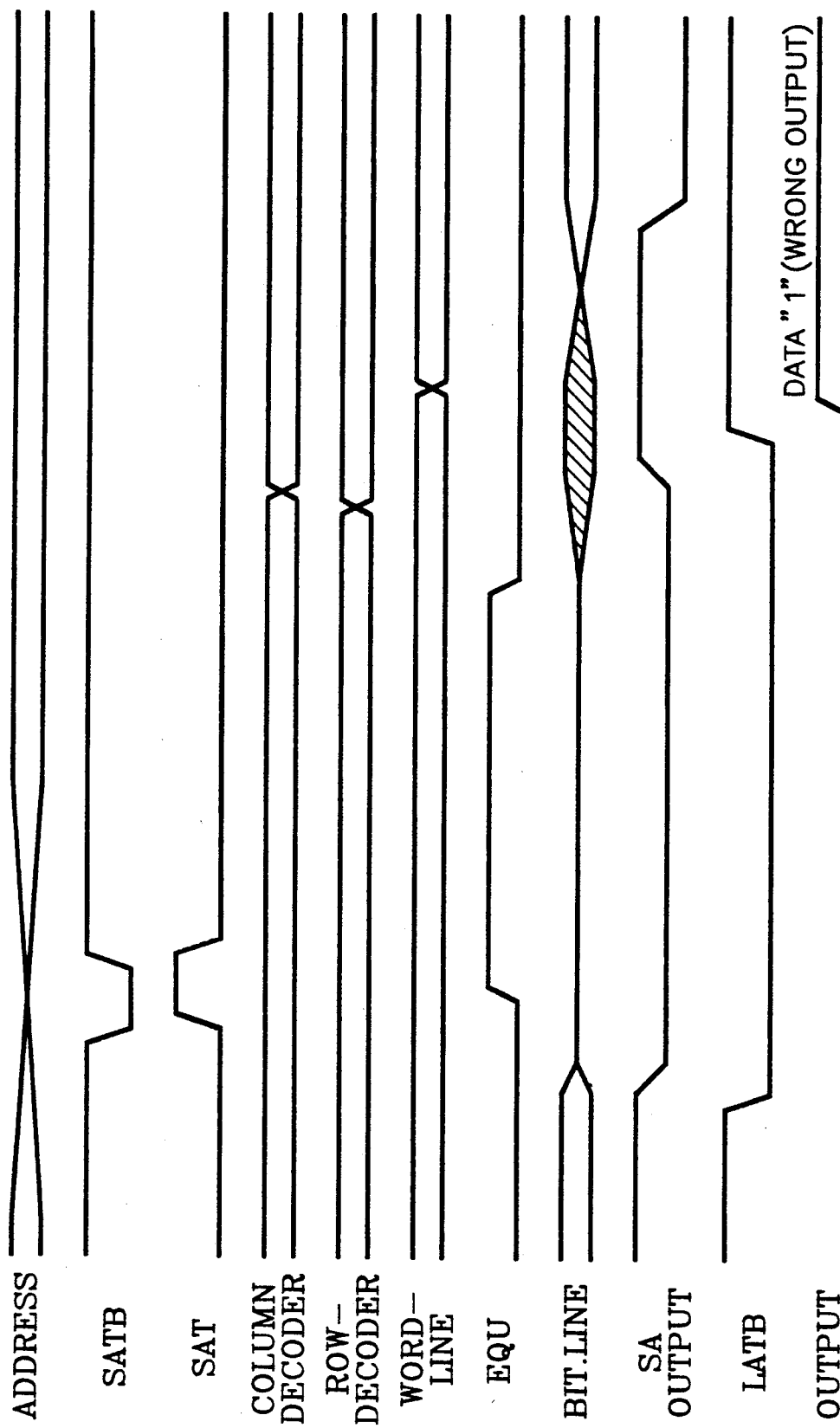
FIG. 6 is a timing chart illustrating a read operation during the address floating of the device of FIG. 1.
Figure 11:
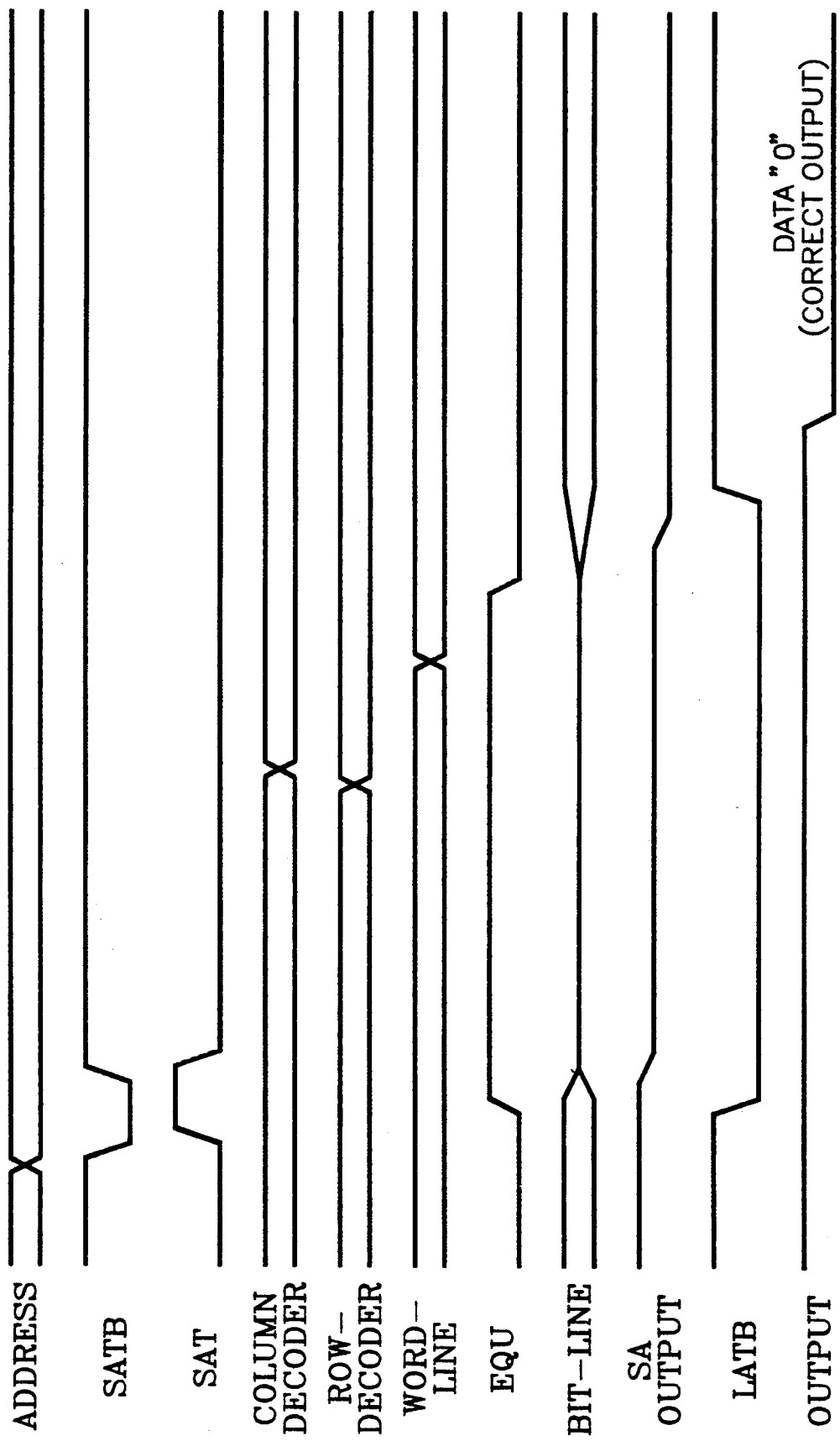
FIG. 11 is a timing chart illustrating a read operation during the normal operation of the circuit of FIG. 7.
Figure 12:
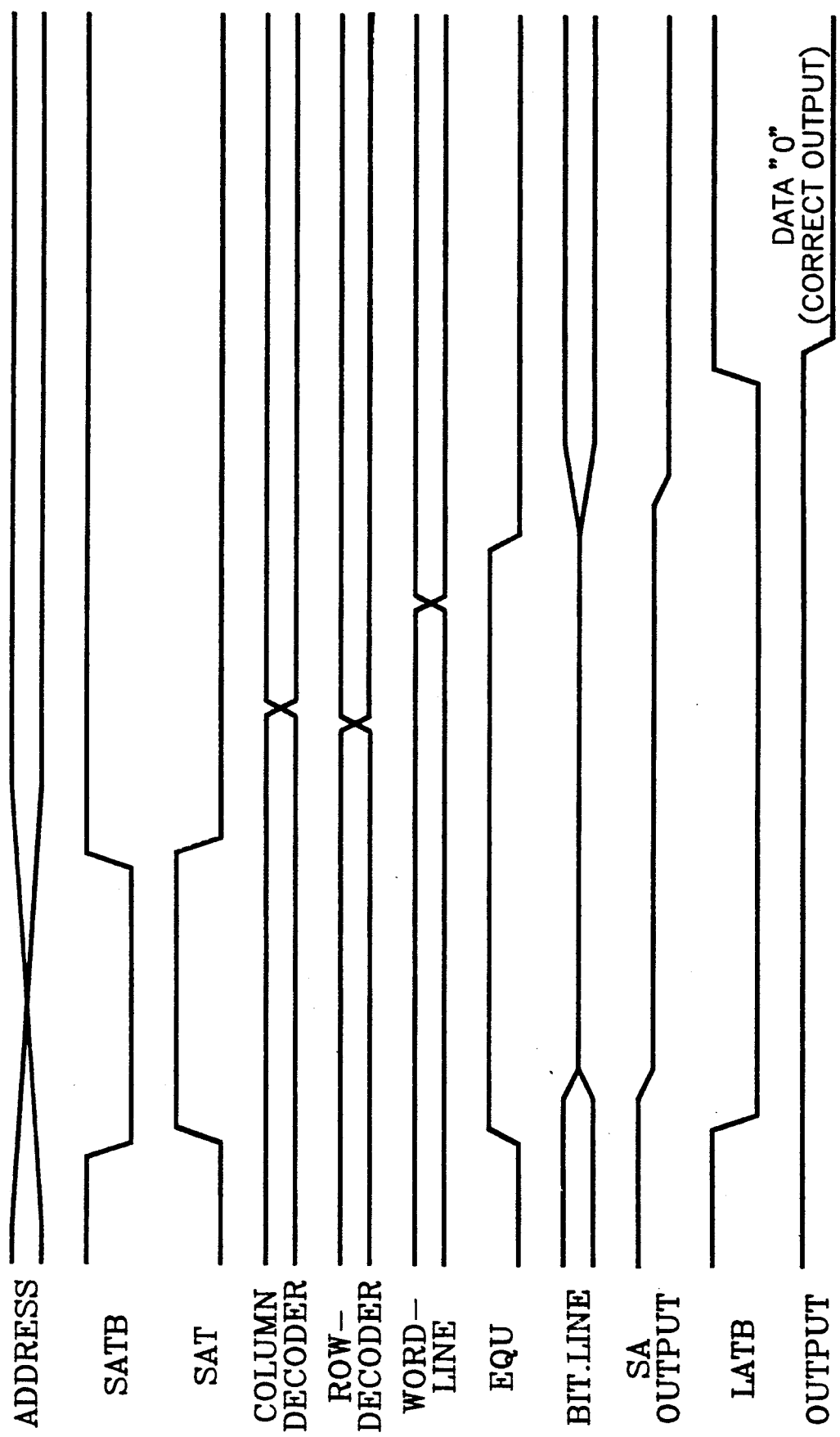
FIG. 12 is a timing chart illustrating a read operation during the address floating of the circuit of FIG. 7.

Next, a read operation is described with reference to FIGS. 11 and 12. The timing diagram of FIG. 11 illustrating a normal read operation is the same as that of FIG. 5. Referring to FIG. 12, if an address signal is slowly transited over a long time, the duration of a short pulse indicating address transition becomes long, and therefore, the synchronization between the decoder and ATD circuits is accomplished. Thus, even if the address signal is slowly transited over a long time, valid data is obtainable.

Figure 9:
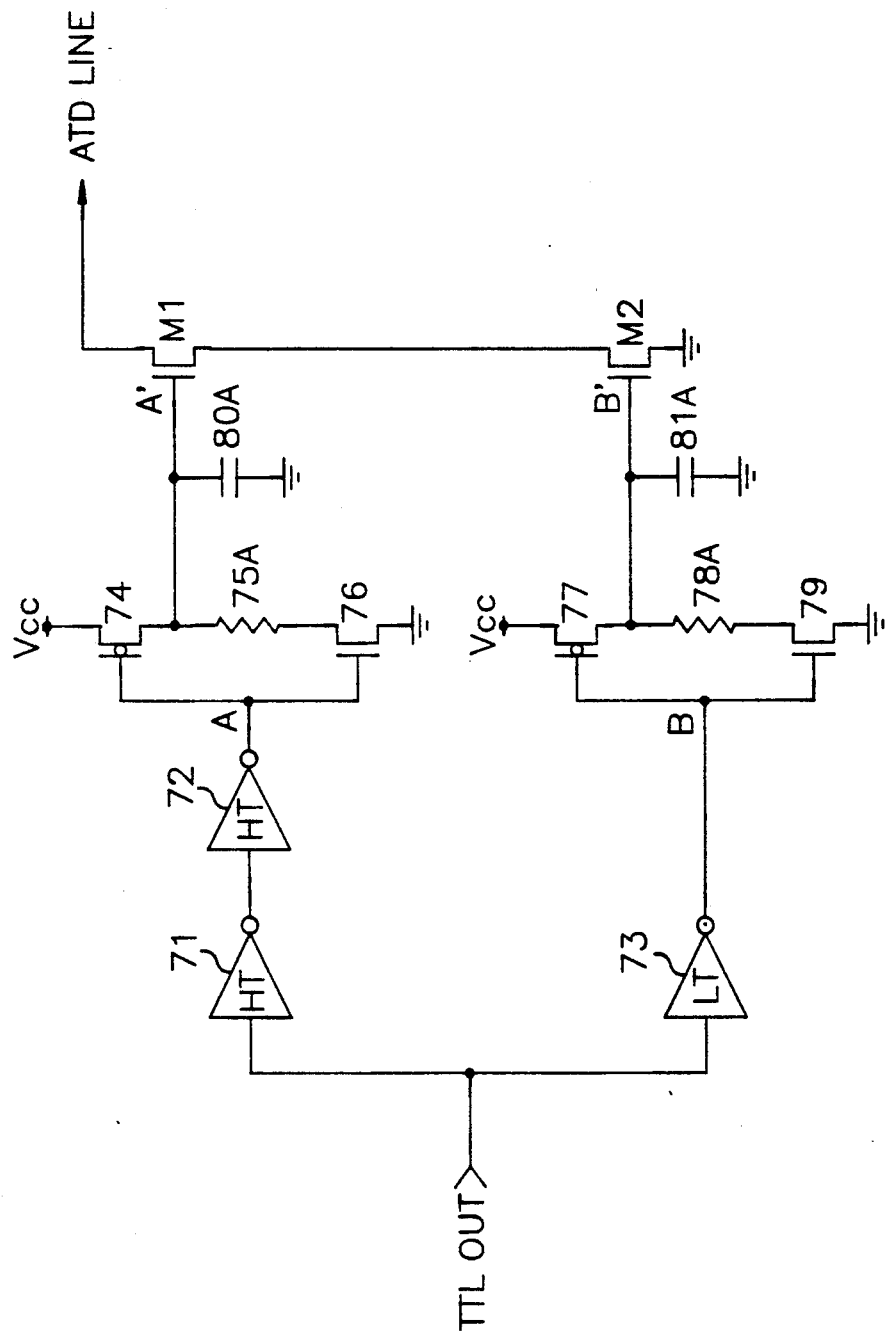
FIG. 9 is a circuit diagram illustrating an ATD of the preferred embodiment according to the present invention.

Referring to FIG. 9, a first inverter 71 having a relatively high trip level as compared to the normal range of a TTL address signal and a third inverter 73 having a relatively low trip level are connected to receive the TTL address input signal. The first inverter 71 is constructed such that a channel size of a load transistor is larger and a channel size of a driving transistor is smaller, and the third inverter 73 is constructed to have a load transistor of small channel size and a driving transistor of large channel size. An ATD short pulse for detecting the address transition is generated by using inverter delay means receiving an output of input nodes A and B. Each inverter delay means consists of a resistive component, a capacitor and a normal inverter. Here, the resistive component of the inverter delay means can be constructed with various components such as an active resistor, a polysilicon layer and a depletion transistor, etc.

Figure 10:
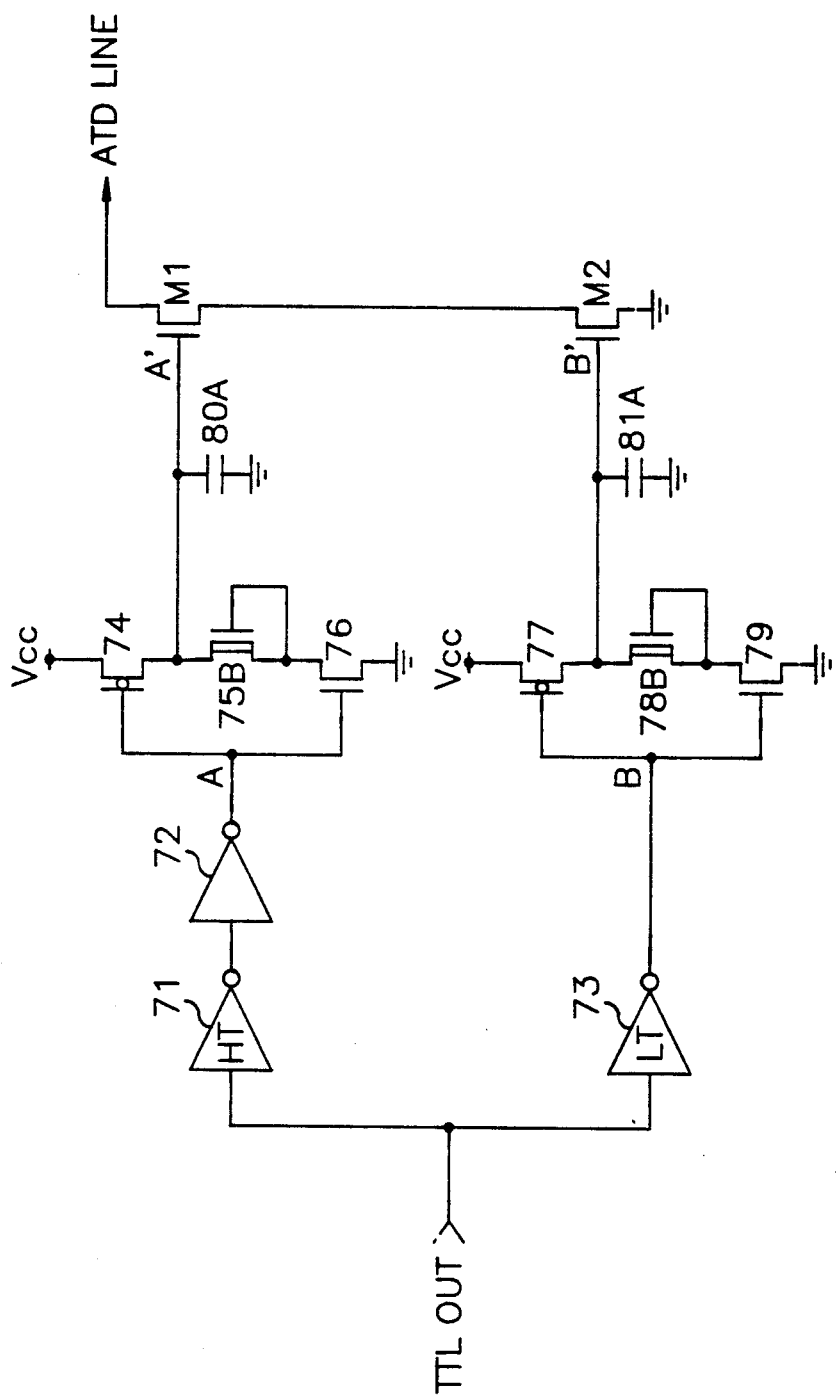
FIG. 10 is a circuit diagram illustrating an ATD of an alternate embodiment according to the present invention.

In FIG. 9, the active resistor or the polysilicon layer is used as the resistive component. Meanwhile, in FIG. 10, the depletion transistor having a small saturation current IDS along with the capacitor is used to generate the short pulse.

The ATD short pulses generated by detecting the transition of each address and chip enable signal are collected by a pulse summator. The collected signals are applied to a pulse generator to generate each pulse which is necessary for control of the circuitry of the integrated circuit. Since the circuit elements except for the ATD circuit are the same as with a conventional circuit, the operation after the ATD short pulse is generated is identical to that of conventional circuit. Thus, no further description of the circuit will be given.

As described above, the address transition is detected by using two inverters having a high trip level and a low trip level. Therefore, an ATD pulse circuit for generating a short pulse while avoiding malfunction of read operations during address floating has been provided.

Consequently, even if the address is varied over a long time, the ATD circuit according to the present invention is not restricted to a particular system application, and the reliability of a semiconductor memory device can be improved by preventing malfunction of the system.

While the present invention has been particularly shown and described with reference to the preferred embodiment thereof, it will be understood by those skilled in the art that foregoing and other changes in form and details, such as the variation of the low and high trip level in harmony with characteristic of the peripheral circuit elements, may be made without departing from the spirit and scope of the present invention.

We claim:

1. An address transition detector circuit for use in a semiconductor memory device having an address buffer circuit for amplifying an external input address signal, a row decoder circuit for selecting a word line among a plurality of word lines, a sense amplifier for sensing data of a cell, and a pulse generator for precharging or equalizing each memory device of an integrated circuit, said address transition detector circuit comprising:

first input means connected to receive an output of said address buffer and having a first trip ratio;

second input means connected to receive said output of said address buffer and having a second trip ratio substantially lower than said first trip ratio;

first output means connected to receive an output of said first input means, for delaying its output only when said output of said first input means is transited from a first state to a second state; and second output means connected to receive an output of said second input means, for delaying its output only when said output of said second input means is transited from the first state to the second state.

2. A circuit as claimed in claim 1, wherein said first input means comprises a first inverting circuit having said first trip ratio such that the ratio of channel width to channel length of a load component thereof is at least four times that of a driving component thereof and a second inverting circuit for receiving and inverting an output of said first inverting circuit.

3. A circuit as claimed in claim 1, wherein said second input means is of an inverting circuit having said second trip ratio, such that the ratio of channel width to channel length of a load component thereof is less than 0.25 times that of a driving component thereof.

4. A circuit as claimed in claim 1, wherein said first and second output means each is of a complementary metal-oxide-semiconductor circuit having resistive means connected between respective driving component and an output line thereof.

5. A circuit as claimed in claim 4, wherein said resistive means is a polysilicon layer or a depletion transistor having a diode-connected gate.

6. A circuit as claimed in claim 1, wherein said first and second states are a logic "low" state under 0.8 volts and a logic "high" state above 2.4 volts, respectively.

7. An address transition detector circuit connected to receive an output of an address buffer circuit for amplifying an external input address signal, for driving a pulse generator precharging or equalizing each memory device of an integrated circuit, said address transition detector circuit comprising:

a first inverting circuit connected to receive an output of said address buffer circuit and having a first trip ratio with respect to said output of said address buffer circuit;

a second inverting circuit connected to receive an output of said first inverting circuit, for inverting said output of said first inverting circuit;

a third inverting circuit connected to receive said output of said address buffer circuit and having a second trip ratio with respect to said output of said address buffer circuit, said second trip ratio being substantially being lower than said first trip ratio;

a first complementary metal-oxide-semiconductor (CMOS) circuit for receiving a first control voltage from said output of said second inverting circuit, and having a first resistive means connected between its output node and a channel of driving transistor of said first CMOS circuit;

a second CMOS circuit for receiving a second control voltage from said output of said third inverting circuit, and having a second resistive means connected between its output node and a channel of a driving transistor of said second CMOS circuit;

a first metal-oxide-semiconductor (MOS) transistor having a channel whose one terminal is connected to a driving line driving said pulse generator, and a gate connected to receive a third control voltage from an output of said first CMOS circuit; and a second MOS transistor having a channel connected between the other terminal of said channel of said first MOS transistor and a ground voltage terminal, and a gate connected to receive a fourth control voltage from an output of said second CMOS circuit.

8. A circuit as claimed in claim 7, wherein said first and second resistive means each is of a depletion N-channel MOS transistor having a gate diode connected to a source thereof, and a channel connected between said output node of the respective CMOS circuit and one terminal of said channel of the respective driving transistor in said respective CMOS circuit.

9. A circuit as claimed in claim 7, wherein said first and second resistive means each is of a polysilicon layer.

10. A circuit as claimed in claim 7, wherein said first and second MOS transistors are of N-channel MOS transistors, respectively.

* * * * *